(12) United States Patent
Hong et al.

(10) Patent No.: US 6,859,081 B2
(45) Date of Patent: Feb. 22, 2005

(54) DUTY CYCLE CORRECTION CIRCUIT AND DELAY LOCKED LOOP HAVING THE SAME

(75) Inventors: Sang-Hoon Hong, Ichon-shi (KR);
Se-Jun Kim, Ichon-shi (KR);
Jeong-Hoon Kook, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/638,994

(22) Filed: Aug. 11, 2003

(65) Prior Publication Data

US 2004/0095174 A1 May 20, 2004

(30) Foreign Application Priority Data

Oct. 30, 2002 (KR) .................... 10-2002-0066425

(51) Int. Cl.[7] .............................................. H03K 3/017
(52) U.S. Cl. ....................................... 327/175; 327/156
(58) Field of Search .............................. 327/172–176, 327/149, 150, 156–161; 331/2, 25, DIG. 2; 375/373–376

(56) References Cited

U.S. PATENT DOCUMENTS

| | | | |
|---|---|---|---|
| 5,614,855 A | 3/1997 | Lee et al. .................... 327/158 |
| 6,169,434 B1 | 1/2001 | Portmann ................... 327/175 |
| 6,198,322 B1 * | 3/2001 | Yoshimura ................. 327/175 |
| 6,320,438 B1 | 11/2001 | Arcus ......................... 327/175 |
| 6,342,801 B1 | 1/2002 | Shin ........................... 327/175 |
| 6,384,652 B1 | 5/2002 | Shu ............................ 327/175 |
| 6,452,432 B2 * | 9/2002 | Kim ........................... 327/158 |
| 6,466,071 B2 | 10/2002 | Kim et al. .................. 327/175 |
| 6,518,809 B1 | 2/2003 | Kotra ......................... 327/175 |
| 6,677,792 B2 * | 1/2004 | Kwak ......................... 327/158 |
| 6,703,879 B2 * | 3/2004 | Okuda et al. ............... 327/158 |
| 2002/0079941 A1 | 6/2002 | Jung et al. |
| 2002/0084818 A1 | 7/2002 | Cho |

* cited by examiner

*Primary Examiner*—Minh Nguyen
(74) *Attorney, Agent, or Firm*—Blakely Sokoloff Taylor & Zafman

(57) ABSTRACT

A duty cycle correction (DCC) circuit including first and second clock dividers for dividing ordinary and sub-input clocks. Optional first and second variable delay devices delay the divided clocks. First and second mixers mix an optionally delayed ordinary divided clock and sub-ordinary divided clock, or an ordinary divided clock and an optionally delayed sub-ordinary divided clock. A logic combination device is included to produce a clock at the same frequency as the ordinary and sub-input clocks, with a corrected duty cycle.

8 Claims, 4 Drawing Sheets

DUTY CYCLE CORRECTION CIRCUIT AND DELAY LOCKED LOOP HAVING THE SAME

FIELD OF THE INVENTION

The present invention relates to a semiconductor circuit, and more particularly, to a duty cycle correction circuit (DCC) and a delay locked loop (DLL) having the same.

DESCRIPTION OF RELATED ARTS

Usually, a clock is used as a reference for adjusting operation timing. The clock is also used for guaranteeing much more rapid operation without any error. When an external clock, which is externally inputted, is used in an internal circuit as an internal clock, a time delay is generated by the internal circuit. The DLL is used to obtain a same phase of the internal clock and the external clock by compensating the time delay between the external clock and internal clock.

Also, the DLL is less affected by a noise than a conventional phase locked loop (PLL). Consequently, the DLL is commonly used for a double data rate synchronous DRAM (DDR SDRAM) and a synchronous semiconductor memory. Also, the DLL is classified by methods of controlling the delay, and recently, an analog DLL, a digital DLL and a register controlled DLL have being commonly used.

The DLL used for a synchronous semiconductor memory device receives the external clock and compensates delay of a real clock path and data path. An output of data is then synchronized with the external clock by reflecting a negative delay in advance.

Also, as an operation speed of a device is increased, a duty cycle of the clock is frequently strayed because of a clock distortion. As a result, an operation fail of the DLL occurs easily and a deterioration of a device capability is induced. In addition, the clock duty cycle of the DLL circuit may be distorted. Accordingly, maintenance of the clock duty cycle (50:50) for the DLL circuit is also required.

To compensate a change of the clock duty cycle, a duty cycle correction circuit is used for the DLL circuit.

FIG. 1 is a diagram showing a conventional analog DLL including the duty cycle correction circuit.

Referring to FIG. 1, the conventional analog DLL includes: a clock input buffer 10 for outputting the internal clock by buffering the external clocks (CLK and CLKB); a first DCC circuit 11 for correcting the duty cycle of the internal clock outputted from the clock input buffer 10; a first and a second delay line 12 and 13 receiving the internal clock corresponding to the external clocks (CLK and CLKB); a delay model 14 for reflecting the delay elements of the real clock path and data path by receiving the output of the first and second delay line 12 and 13; a phase detector for comparing the phases of the external clocks (CLK and CLKB) with the output of the delay model 14; an electrical charge pump 16 for supplying an output voltage corresponding to the output of the phase detector 15 to the first and the second delay line 12 and 13; a DLL driver 17 for outputting a DLL clock (clk_dll) by driving the clock of which the delay in the first and second delay line 12 and 13 is adjusted; and a second DCC circuit 18 for correcting the duty cycle of the DLL clock clk_dll outputted from the DLL driver 17. Commonly, the output of the electrical pump 16 is filtered through a loop filter and inputted to the first and the second delay line 12 and 13 even if the loop filter is not illustrated.

In a view-point of the external clock (CLK), the analog DLL compares the clock signal which has passed through the clock input buffer 10, the first delay line 12 and the delay model, with the phase of the external clock (CLK) by using a phase detector 15, and thereafter, estimating whether a clock signal outputted from the delay model 14 has an advanced phase or a lagged phase and a corresponding signal is outputted.

At this time, the electrical pump 16 controls the output voltage by carrying out an electrical charge dumping responding to the output of the phase detector 15, and delay values of the first and the second delay line 12 and 13 are changed in proportion to the output voltage of the electrical charge pump 16. More specifically, a delay time caused by the first and the second delay line 12 and 13 is decreased if the output voltage of the electrical charge pump 16 becomes higher and increased if the output voltage of the electrical charge pump 16 becomes lower. As a result, the phase of the delay model 14 becomes same as that of the external clock CLK by repeating the above-mentioned two steps, and thus, the DLL clock (clk_dll) can be outputted from the DLL driver 17.

FIG. 2 is a circuit diagram illustrating the first DLL circuit 11 of FIG. 1.

Referring to FIG. 2, the first DLL circuit 11 includes a bias NMOS transistor receiving a bias voltage as a gate input; two input NMOS transistors M2 and M3 respectively receiving outputs (clk and clk_b) of a clock input buffer 10 as gate inputs; two PMOS transistors M4 and M5 constituting a current mirror together with the input NMOS transistor M3; two PMOS transistors M6 and M7 constituting another current mirror together with the input NMOS transistor M2; a first capacitor C1 disposed between a sub ordinary output unit (dccfb_b), which is connected to the PMOS transistor M4 and input NMOS transistor, and a ground, and a second capacitor C2 connected to an ordinary output unit (dccfb) connected to the PMOS transistor M7 and input NMOS transistor M3.

In the conventional DCC circuit having above mentioned constitution, in case that duty cycles of the outputs (clk and clk_b) from the clock input buffer 10 are different from each other, electrical current passing through the input NMOS transistors M2 and M3 is varied, and thus, output current of each current mirror is also varied. As a result, electrification amounts of capacitors C1 and C2 connected to the output units (dccfb_b and dccfb) become different. Such different electrification amounts induce a potential difference between the output units (dccfb_b and dccfb). Also, an output signal having such a potential difference gets feedback to the clock input buffer 10, and the duty cycles of the outputs (clk and clk_b) from the clock input buffer 10 are adjusted to be 50%. At this time, the potential difference between the output units of the DCC circuit disappears.

The constitution and operation of the DCC circuit are applied to a second DCC circuit 18 too.

According to the prior art, the duty cycle change caused by the distortion of the external clock and the DLL circuit is corrected by disposing two DCC circuits before and behind the delay line of the DLL and connecting the DCC circuits to the delay line.

However, the conventional DCC circuit has some drawbacks. As shown in FIG. 2, the DCC circuit is an analog type and thereby, consuming much power. Furthermore, the DCC circuits should be disposed before and behind the delay line of the delay line and thereby, occupying too much chip area.

SUMMARY OF THE INVENTION

It is, therefore, an object of the present invention to provide a duty cycle correction circuit (DCC) and a delay locked loop (DLL) including the same in order to reduce a power consumption.

In accordance with an aspect of the present invention, there is provided the duty cycle correction circuit (DCC), including: a first clock dividing unit and a second clock dividing unit for dividing an ordinary input clock and a sub ordinary input clock; a first clock mixing unit; a second clock mixing unit; and a logic combination unit for generating a duty cycle correction clock. In addition, The inventive delay locked loop (DLL), including: a first and second clock dividing unit; a frequency detecting unit; a first variable delaying unit; a second variable delaying unit; a first clock mixing unit; a second clock mixing unit; and a logic combination unit.

BRIEF DESCRIPTION OF THE DRAWINGS

Other objects and aspects of the present invention will become apparent from the following description of the embodiments with reference to the accompanying drawings, in which.

DETAILED DESCRIPTION OF THE PREFERRED EMBODIMENTS

Hereinafter, an inventive a duty cycle correction circuit (DCC) and a delay locked loop (DLL) including the same will be described in detail referring to the accompanying drawings.

Figure 1:
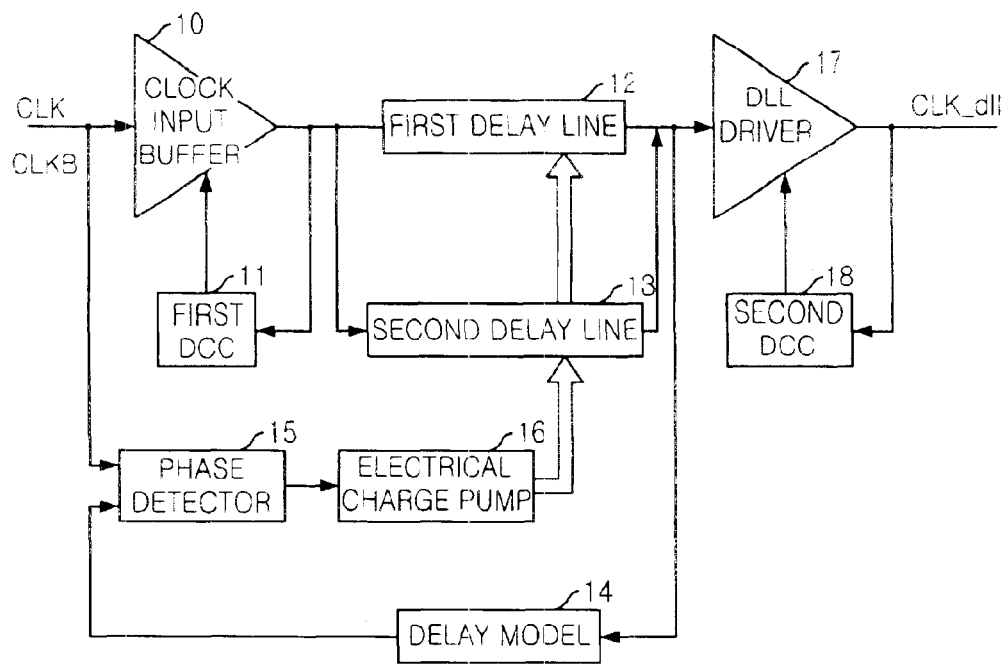
FIG. 1 is a block diagram showing a conventional analog DLL using an duty cycle correction circuit.
Figure 2:
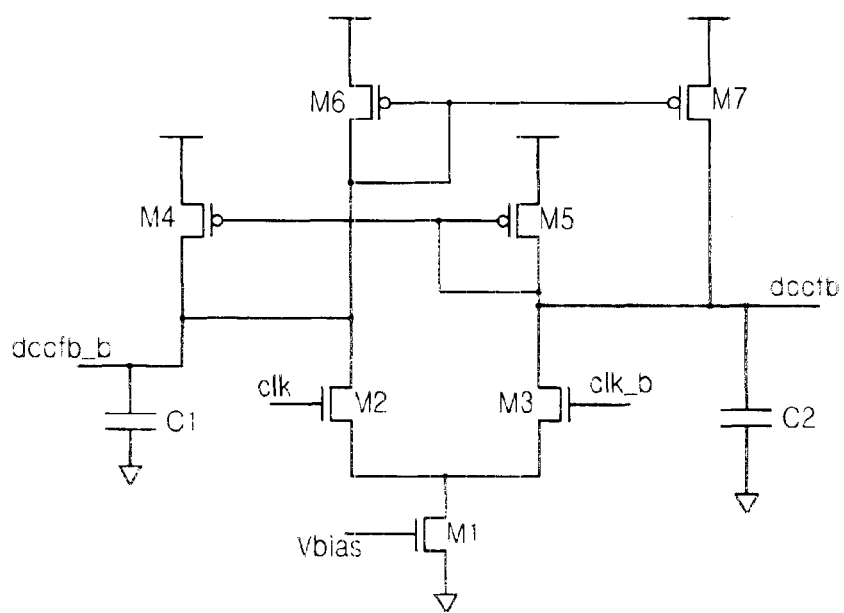
FIG. 2 is a circuit diagram illustrating a first DCC circuit in FIG. 1.
Figure 3:
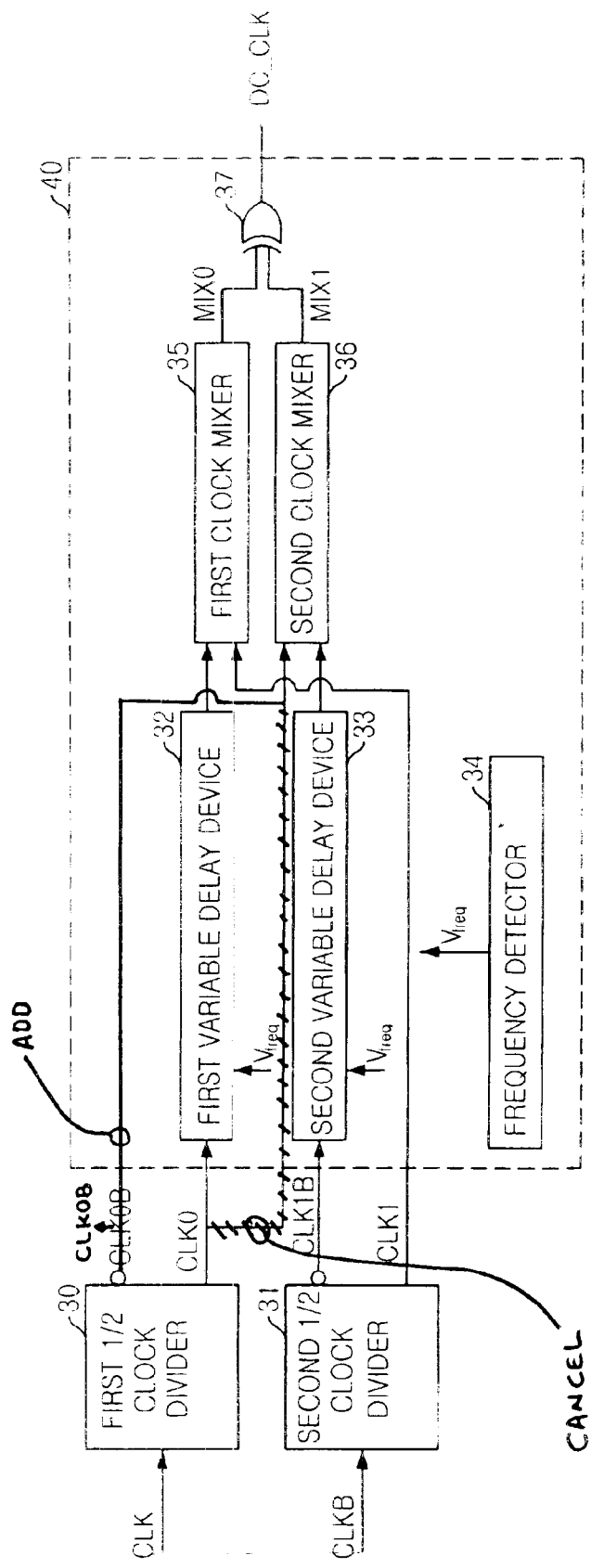
FIG. 3 is a block diagram depicting a DCC circuit in accordance with a preferred embodiment of the present invention.

FIG. 3 is a block diagram showing a DCC circuit in accordance with a preferred embodiment of the present invention.

Referring to FIG. 3, the DCC circuit includes: a first ½clock divider 30 for generating ordinary divided clocks (CLK0 and CLK0B) which are obtained by dividing an ordinary input clock (CLK) by 2; a second ½clock divider 31 for generating clocks (CLK1 and CLK1B) which are obtained by dividing a sub ordinary input clock (CLKB) by 2; and a DCC core 40 for generating a duty cycle corrected clock (DC_CLK) having a corrected duty cycle, by correcting the duty cycle of outputs from the first and second clock divider 30.

The DCC core 40 includes: a frequency detector 34 for generating a voltage signal (Vfreq) varied in proportion to a wave frequency; a first variable delay device 32 for delaying an ordinary divided clock (CLK0) outputted from the first ½clock divider 30 up to a predetermined time based on a control of the voltage signal (Vfreq) to generate a first delayed system and outputting the first delayed signal; a second variable delay device 33 for delaying an sub ordinary divided clock (CLK1B) output from the second ½clock divider 31 up to a predetermined time based on the voltage signal (Vfreg) to generate a second delayed signal and outputting the second delayed signal; a first clock mixer 35 for mixing the first delayed signal from the first variable delay device 32 and the ordinary divided clock (CLK1) outputted from the second ½clock divider 31 to generate a first mixed signal; a second clock mixer 36 for mixing the second delayed signal outputted from the second variable delay device 33 and the sub ordinary divided clock (CLK0B) outputted from the first ½clock divider 30 to generate a second mixed signal; and an XOR gate 37 for performing an exclusive OR operation for the first mixed signal (MIX1) of the first clock mixer 35 and the second mixed signal (MIX2) of the second clock mixer 36.

Figure 4:
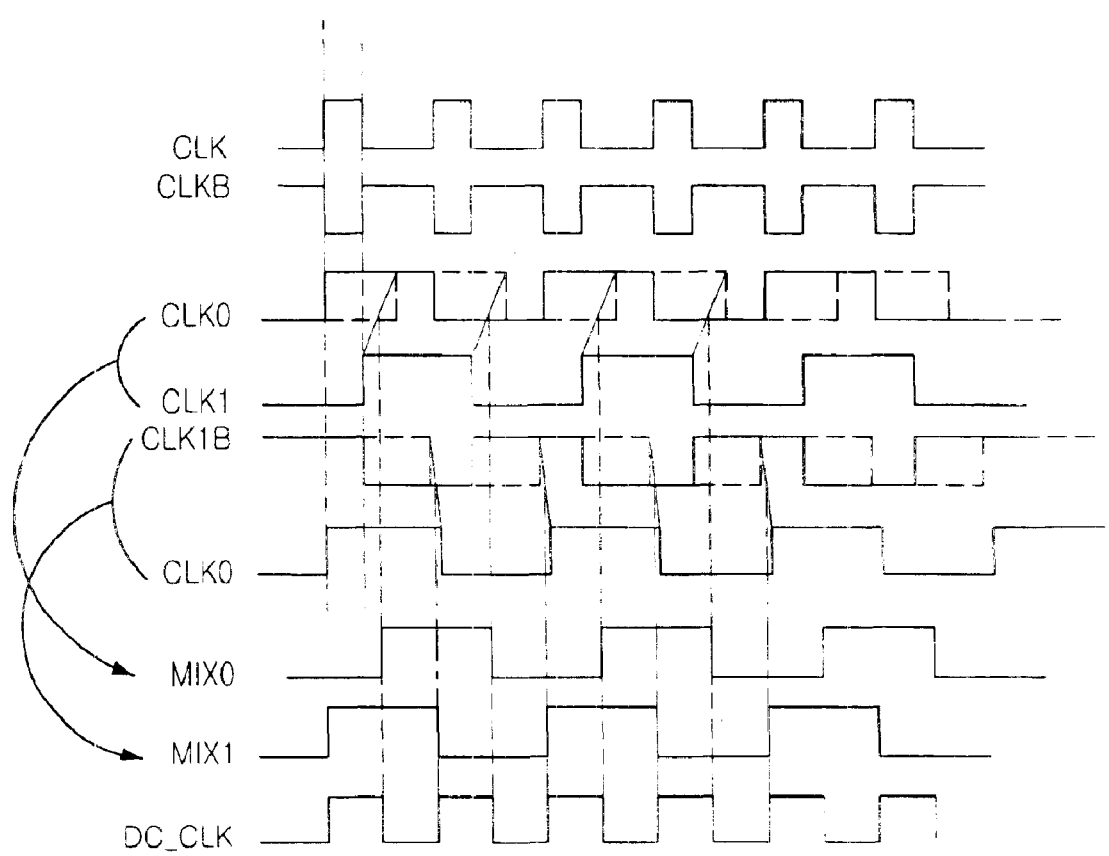
FIG. 4 is a diagram showing waveforms for an operation of the DCC circuit in FIG. 3.

FIG. 4 is a diagram showing a waveform for the operation of the DCC circuit shown in FIG. 3. Henceforth, it is supposed that the duty cycle of the ordinary and sub ordinary input clock (CLK and CLKB) is distorted.

First, the first ½clock divider 30 receives the ordinary input clock (CLK), divides the ordinary input clock (CLK) by 2 and generate the ordinary divided clock (CLK0) having a clock cycle corresponding to two clock cycles from a rising edges of CLK, and the sub ordinary divided clock, which is a reverse signal of CLK0. Also, the second ½clock divider 31 receives the sub ordinary input clock (CLKB), divides the sub ordinary input clock (CLKB) by 2 and generates the ordinary divided clock CLK1 having a clock cycle corresponding to two clock cycles of CLK from a rising edges of CLKB and CLK1B, which is a reverse signal of CLK1.

Next, the ordinary input clock (CLK0) is delayed by the first variable delay device 32, and the sub ordinary divided clock (CLK1B) is delayed by the second variable delay device 32. At this time, delay amounts of the first and the second variable delay devices 32 and 33 are varied by the voltage signal (Vfreq) outputted from the frequency detector 34, and each of delay is identical to each other. The frequency detector 34 is a circuit for varying an output voltage by changing the frequency of the ordinary input clock (CLK). As a method for embodying the frequency detector circuit simply, it is suggested that the number of clock transfers during a constant clock cycle are counted and thereafter, converted to an analog value through a digital-analog converter. The first and second delay devices 32 and 33 perform operations to make two clock signals having an identical phase in order to be well combined in the first and second clock mixer 35 and 36. Also, the aforementioned analog value depends on the frequency of the input clock. Therefore, the frequency detector 34 is used. In case that the frequency of the input clock is increased, the voltage signal (Vfreq) is increased.

In a meantime, the first delayed clock CLK0, dotted line in FIG. 4, becomes the first combined signal by passing through the first clock mixers. The second delayed clock CLK1B, dotted line in FIG. 4, is combined with ordinary divided clock CLK0 in the second mixer 36. Herein, a mean value between the phases of clock edges of the clocks is used for mixing those clocks.

The exclusive OR operation is performed with first and second mixed signals (MIX0 and MIX1) of the first and second clock mixers 35 and 36 at the XOR gate 27. As a result, the duty cycle of the clocks becomes exactly 50%, and the duty cycle corrected clock DC-CLK having the clock cycle identical to the input clocks (CLK and CLKB) is generated.

Figure 5:
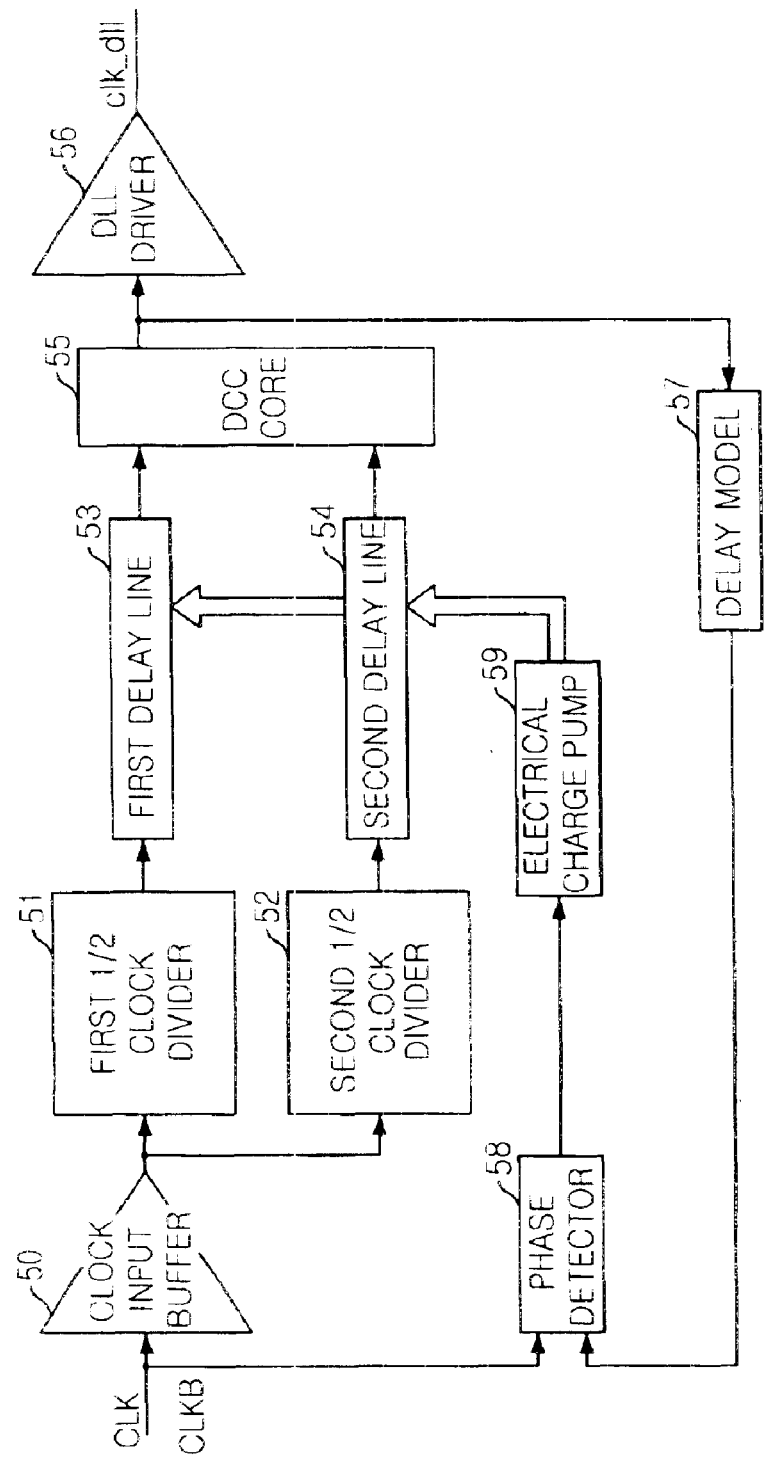
FIG. 5 is a block diagram illustrating a block constitution of the analog DLL including the DCC circuit in FIG. 3.

FIG. 5 is a diagram showing the analog DLL including the DCC circuit shown in FIG. 3.

Referring to FIG. 5, the analog DLL including the DCC circuit has a constitution and is operated similar to the conventional analog DLL. However, in the present invention, the ordinary input clock CLK is passed to the first ½clock divider 51 is disposed before the first delay line 53, and the sub ordinary input clock CLKB is passed through the second ½clock divider 52 is disposed before the second delay line 54. Also, the DCC core 55 is disposed after the first and second delay lines 53 and 54.

The first and second ½clock dividers 51 and 52 and the DCC core 55 are disposed between the first delay line 53 and the second delay line 54 in order to prevent more distortion of the distorted duty cycles of the input clocks (CLK and CLKB). Once the clocks are divided, exactly, 50% duty cycles are obtained. Consequently, a possibility of a wrong operation caused by the distortion brought about by the DLL itself is minimized. Furthermore, the DCC core 55 is disposed after the first and second delay lines 53 and 54 and thereby, ensuring that the exact the 50% duty cycle is obtained. Such operation of the DCC circuit is merely obtained in a normal DLL operation state.

In the preferred embodiment of the present invention, the frequency detector and the first and second variable delay devices are used, providing more effective mixing of the clocks. However, there is not much difference if the frequency detector and the first and second variable delay devices are not used.

Furthermore, although ½clock divider is used to the preferred embodiment of the present invention, ¼or ⅛clock divider can be also used in the present invention to provide same affection.

Moreover, the present invention is described by using a case DLL circuit is implemented to the analogue DLL. However, the DLL circuit in accordance with the present invention can be implemented to other kinds of DLL such as a register controlled DLL or a digital DLL.

As mentioned above, the present invention can reduce electric consumption of DLL circuit. Also, an area occupied by the DLL circuit is reduced.

While the present invention has been shown and described with respect to the particular embodiments, it will be apparent to those skilled in the art that many changes and modification may be made without departing from the spirit and scope of the invention as defined in the appended claims.

What is claimed is:

1. A duty cycle correction circuit, comprising:
    a first clock dividing means for dividing an ordinary input clock into a first ordinary divided clock and a first sub divided clock;
    a second clock dividing means for dividing a sub input clock into a second ordinary divided clock and a second sub divided clock;
    a first clock mixing means for mixing the first sub divided clock outputted from the first clock dividing means and the second ordinary divided clock outputted from the second clock dividing means;
    a second clock mixing means for mixing the first ordinary divided clock outputted from the first clock dividing means and the second sub divided clock outputted from the second clock dividing means; and
    a logic combination means for generating a duty cycle correction clock having a same clock cycle as the ordinary and sub input clocks by logically combining outputs of the first or second clock mixing means.

2. The duty cycle correction circuit as recited in claim 1, wherein the first and second clock dividing means includes ½clock dividers, respectively.

3. The duty cycle correction circuit as recited in claim 1, further comprising:
    a first delay unit for delaying the first ordinary divided clock; and
    a second delay unit for delaying the second sub divided clock.

4. The duty cycle correction circuit as recited in claim 1, further comprising:
    a first delay unit for delaying the first sub divided clock; and
    a second delay unit for delaying the second ordinary divided clock.

5. A duty cycle correction circuit, comprising:
    a first clock division means and a second clock division means for generating an ordinary output clock and a sub output clock by dividing an ordinary input clock and a sub input clock by ½, respectively;
    a frequency detector for detecting a frequency of the ordinary input clock and the sub input clock and generating a voltage signal corresponding to the detected frequencies;
    a first variable delaying means for generating a first delayed signal by delaying the ordinary output clock of the first clock division means based on the voltage signal;
    a second variable delaying means for generating a second delayed signal by delaying the sub output clock of the second clock division means based on the voltage signal from the frequency detector;
    a first clock mix means for mixing the first delayed signal and the sub ordinary output clock of the second clock division means and generating a first mixed signal;
    a second clock mix means for mixing the ordinary output clock and the second delayed signal and generating a second mixed signal; and
    a logic combination means for generating a duty cycle correction clock having a clock cycle identical to that of the ordinary or sub input clock by a logically combining the first and second mixed signals.

6. The duty cycle correction circuit as recited in claim 5, wherein the logic combination means includes an XOR gate receiving the first mixed signal and second mixed signal.

7. A delay locked loop (DLL) having a first and second delay lines for delaying an ordinary input clock and a sub ordinary input clock, the delay locked loop (DLL) comprising:
    a first and second clock division means being disposed before the first and second delay lines for dividing the ordinary input clock and the sub ordinary input clock by ½, and generating a first divided signal and a second divided signal, respectively;
    a frequency detecting means for detecting frequencies of the ordinary input clock and sub ordinary input clock, and generating a voltage signal corresponding to the detected frequencies;
    a first variable delaying means for generating a first delayed signal by delaying an output clock of the first delay line corresponding to the first divided signal from the first clock division means according to the voltage signal;
    a second variable delaying means for generating a second delayed signal by delaying the output clock of the second delay line corresponding to the second divided signal from the second clock division means according to the voltage signal;
    a first clock mixing means for mixing the output clock of the second delay line and the first delayed signal of first variable delaying means corresponding to the second divided signal of the second clock division means;

a second clock mixing means for mixing the output clock of the first delay line and the second delayed signal of second variable delaying means corresponding to the first divided signal of the first clock division means; and a logic combination means for generating a duty cycle correction clock having a clock cycle identical to that of the ordinary and sub ordinary input clocks by logically combining the first mixed signal from the first clock mixing means and second mixed signal from the second clock mixing means.

8. The delay locked loop (DLL) as recited in claim 7, wherein the logical combination means includes an XOR gate receiving the first mixed signal and second clock mixed signal as inputs.

* * * * *